United States Patent
Gunther et al.

(10) Patent No.: US 8,131,034 B2
(45) Date of Patent: Mar. 6, 2012

(54) EFFICIENT VISUALIZATION OF CORTICAL VASCULAR TERRITORIES AND FUNCTIONAL MRI BY CYCLED ARTERIAL SPIN LABELING MRI

(75) Inventors: Matthias Gunther, Bruchsal (DE); David Feinberg, Sebastapol, CA (US)

(73) Assignee: Advanced MRI Technologies, LLC, Sebastopol, CA (US)

( * ) Notice: Subject to any disclaimer, the term of this patent is extended or adjusted under 35 U.S.C. 154(b) by 416 days.

(21) Appl. No.: 11/915,102

(22) PCT Filed: May 19, 2006

(86) PCT No.: PCT/US2006/019880
§ 371 (c)(1),
(2), (4) Date: Jun. 19, 2009

(87) PCT Pub. No.: WO2006/127687
PCT Pub. Date: Nov. 30, 2006

(65) Prior Publication Data
US 2010/0274117 A1    Oct. 28, 2010

(51) Int. Cl.
*G06K 9/00*    (2006.01)
*A61B 5/05*    (2006.01)
(52) U.S. Cl. .................................. 382/128; 600/410
(58) Field of Classification Search .......... 382/128–132; 600/410–419
See application file for complete search history.

(56) References Cited

U.S. PATENT DOCUMENTS

| | | | |
|---|---|---|---|
| 4,669,481 A | 6/1987 | Eisenberg et al. | |
| 4,877,599 A | 10/1989 | Lees | |
| 5,402,785 A | 4/1995 | Leigh et al. | |
| 5,465,718 A * | 11/1995 | Hochman et al. | 600/420 |
| 5,560,360 A * | 10/1996 | Filler et al. | 600/408 |
| 5,590,654 A | 1/1997 | Prince | |
| 5,699,798 A * | 12/1997 | Hochman et al. | 600/420 |
| 5,792,056 A * | 8/1998 | Prince | 600/420 |
| 5,845,639 A * | 12/1998 | Hochman et al. | 600/407 |

(Continued)

OTHER PUBLICATIONS

Mar. 29, 2011 European search report in connection with counterpart European patent application No. 06 77 0929.

(Continued)

*Primary Examiner* — Manav Seth
(74) *Attorney, Agent, or Firm* — Cooper & Dunham, LLP

(57) ABSTRACT

Regional arterial spin labeling (regASL) speeds up acquisition without sacrificing the signal-to-noise ratio (SNR) of the resulting perfusion images by using the same control image (i.e. acquired without labeling of blood in a vessel) for two or more vascular territory measurements. This regional ASL is accomplished by creating prepared spin magnetization (e.g. inverted or saturated) in a specific blood vessel, instead of preparing spin magnetization in all feeding blood vessels. As in conventional ASL, two data sets are typically acquired in a downstream position: one with (label image) and one without preparation (control image) in one particular vessel. When regASL is extended to repetitive time series of ASL images to identify perfusion changes for functional MRI (fMRI), the speed of the time series of ASL also is increased because only a single C data set can be used redundantly for all time points of ASL measurement, to reduce the amount of data acquired by nearly one half, with no change in the signal to noise ratio in the ASL images. To account for possible movement of the person causing misregistrations in the time series, the C data can be obtained two or more times throughout the time series while still at lower frequency than in prior techniques with alternating L and C data sets.

3 Claims, 6 Drawing Sheets

U.S. PATENT DOCUMENTS

| | | | |
|---|---|---|---|
| 5,846,197 A | | 12/1998 | Edelman |
| 6,161,031 A * | | 12/2000 | Hochman et al. ............ 600/407 |
| 6,196,226 B1 * | | 3/2001 | Hochman et al. ............ 600/425 |
| 6,233,480 B1 * | | 5/2001 | Hochman et al. ............ 600/476 |
| 6,241,672 B1 * | | 6/2001 | Hochman et al. ............ 600/431 |
| 6,285,900 B1 | | 9/2001 | Stuber et al. |
| 7,640,063 B2 * | | 12/2009 | Rezai et al. .................... 607/45 |
| 2010/0036234 A1 | | 2/2010 | Pfeuffer |

OTHER PUBLICATIONS

Shwarzberger, Christian, et al. (1998), "BASE imaging: A New Spin Labeling Technique for Measuring Absolute Perfusion Changes," Magnetic Resonance in Medicine, vol. 39, pp. 717-722.

Silva, Alfonso C., et al. (1999), "Pseudo-Continuous Arterial Spin-Labeling Technique for Measuring CBF Dynamics With High Temporal Resolution," Magnetic Resonance in Medicine, vol. 42, pp. 425-429.

Wong, Eric C., et al. (2000), "Turbo ASL: Arterial Spin Labeling with Higher SNR and Temporal Resolution," Magnetic Resonance in Medicine, vol. 44, pp. 511-515.

Yang, Yihong, et al. (2000), "A CBF-Based Event-Related Brain Activation Paradigm: Characterization of Impulse-Response Fucnction and Comparison to BOLD," NeuroImage, vol. 12, pp. 287-297.

Duyn, Jeff H.., et al. (2001), "High-Sensitivity Single-Shot Perfusion-Weighted tMRI," Magnetic Resonance in Medicine, vol. 46, pp. 88-94.

Lu, H., et al. (2005), "Noise or Artifact: Detrimental Effects of BOLD Signal in Arterial Spin Labeling fMRI at High Field Strength," Proceedings of the International Society for Magnetic Resonance in Medicine, 13, p. 35.

* cited by examiner

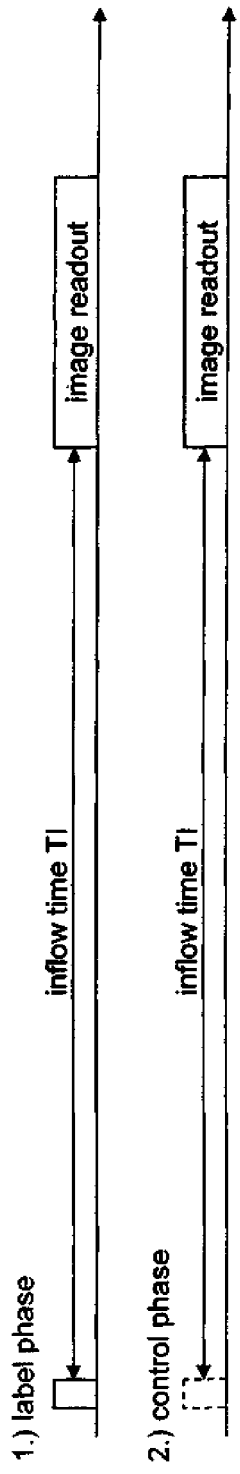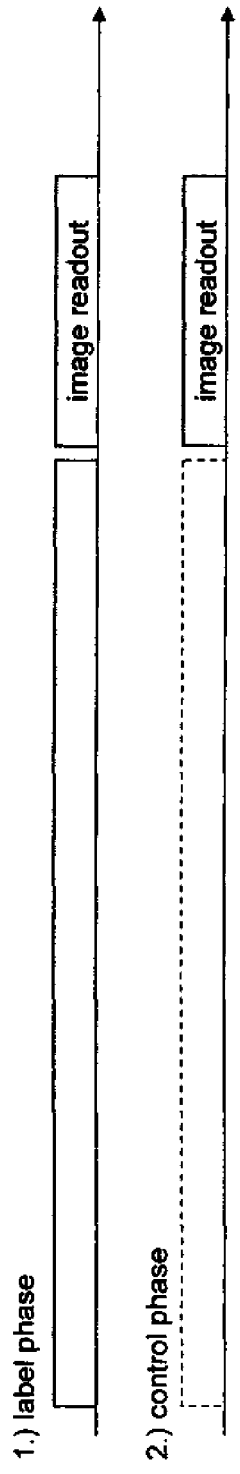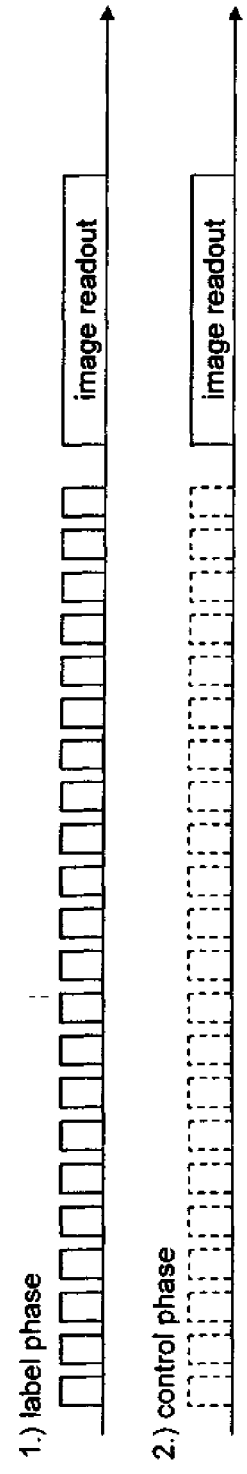
Fig. 3a) conventional pulsed ASL
Fig. 3b) conventional continuous ASL
Fig. 3c) pseudo continuous ASL

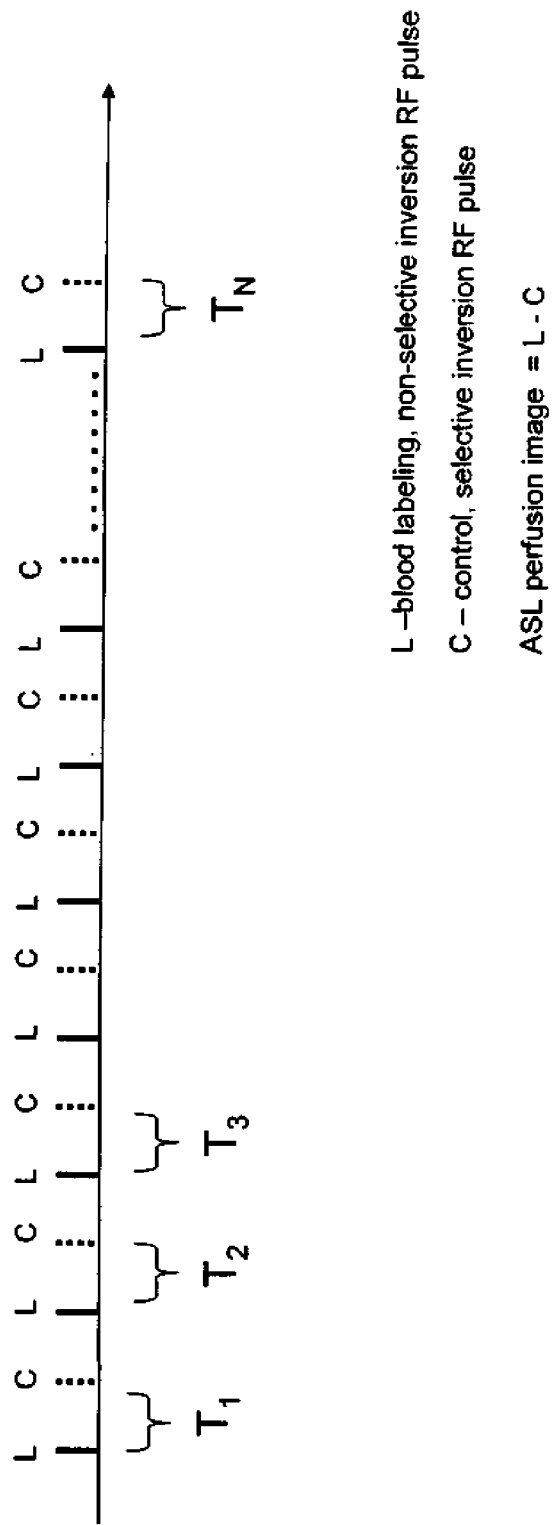
Fig. 4 ASL Time series using pairs of label and control at incremental Times (T) (Prior Art)
L – blood labeling, non-selective inversion RF pulse
C – control, selective inversion RF pulse
ASL perfusion image = L - C
Fig. 5 Using signal averaging; repeating 4 times (Prior Art)

Increased temporal resolution in time series of ASL images with shared control

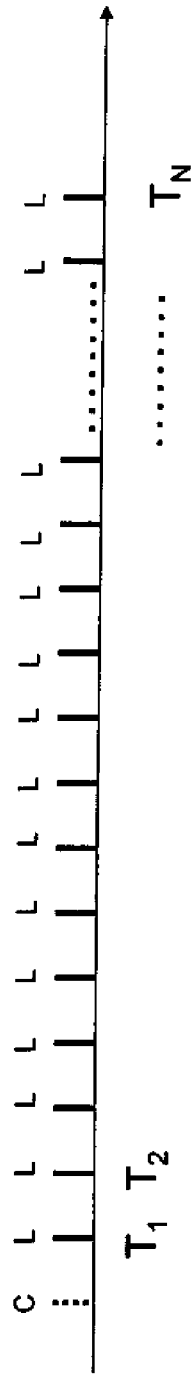

Fig. 6.1.) Using one control (C) combined with each label (L) at different time intervals reduces time increment by half.

Fig. 6.2.) Using two controls (C) to be combined with label (L) signals at different time intervals.

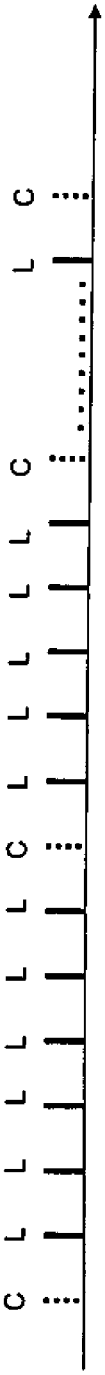

Fig. 6.3.) A few controls (C) to be combined with label (L) signals at different time intervals.

Increased temporal resolution in time series of ASL images using different inflow times for each image

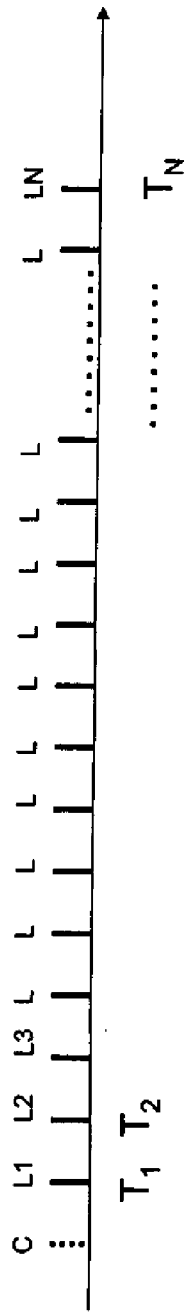

Fig. 7.1.) Using one control (C) combined with each label (L) at different time intervals reduces time increment by half.

L1..LN –blood labeling using different inflow times TI (1..N)

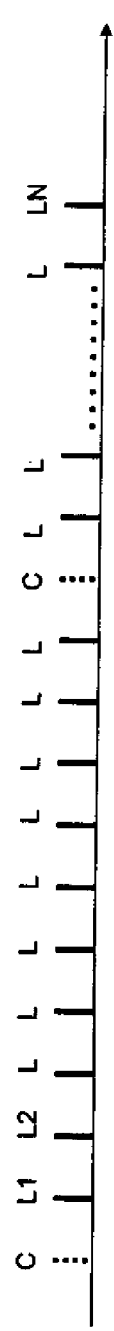

Fig. 7.2.) Using two controls (C) to be combined with label (L) signals at different time intervals.

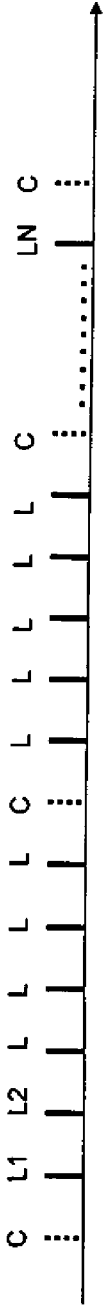

Fig. 7.3.) A few controls (C) to be combined with label (L) signals at different time intervals.

EFFICIENT VISUALIZATION OF CORTICAL VASCULAR TERRITORIES AND FUNCTIONAL MRI BY CYCLED ARTERIAL SPIN LABELING MRI

FIELD OF THE INVENTION

The invention is in the field of magnetic resonance imaging and particularly relates to visualizing cortical vascular territories.

BACKGROUND

Visualization of the different intracranial vascular territories is usually obtained by using angiographic techniques. However, due to the difficulties to visualize the distal vascular bed with any angiographic technique it is difficult to infer the cortical borders of vascular territories. Arterial spin labeling (ASL) MRI provides information on cortical cerebral perfusion. Current techniques perform the labeling in each feeding artery as a separate experiment which is time-consuming. It would be desirable to find a way to acquire all vascular territory within the same experiment without loss of efficiency, and the disclosed invention is directed to this end.

MRI has been extensively developed to obtain angiographic information of vessels (MRA) and perfusion images in organs (1-5) (these numbers refer to the publications cited at the end of this disclosure; 11 publications are cited and their contents are hereby incorporated by reference herein as though fully set out.) The technique of arterial spin labeling (ASL) provides this type of information without the use of exogenous contrast agents but using magnetic labeling of blood spins. ASL is based on the idea that static tissue signal can be suppressed by acquisition of two data sets, which are prepared identically in the imaging region, while the region outside is prepared differently. After subtraction of those two data sets only spins are visible which experienced preparation outside the imaging slab and which were present in the imaging slab at time of acquisition.

The main application of this technique has been measurement of the global regional perfusion in the brain, but ASL is also capable of separating the regional perfusion signal in specific blood vessel territories (6-9). Common to all known published methods is that the blood of each feeding artery is labeled within a separate experiment. This leads to a long total measurement time if multiple vascular territories, such as left and right internal carotid artery (ICA) and basilar artery, need to be acquired (nine to fifteen minutes in (6,7)).

Arterial spin labeling also has been used to measure cerebral blood flow during rest and activation to obtain functional MRI (fMRI) images. (3, 12). As opposed to BOLD contrast, ASL contrast is not based on susceptibility and therefore, it should be possible to perform measurements in regions of high static field inhomogeneities close to tissue-air and tissue-bone interfaces.

To improve signal-to-noise ration (SNR) in ASL, many pairs of measurements (interleaved or consecutive images acquired with (labeled, L) and without (control, C) blood labeling are averaged then subtracted (L-C) to obtain cerebral blood flow or perfusion images. The static tissue in the data set can be suppressed using inversion pulses which tends to null brain static tissue without significantly affecting blood signal to further improve background suppression (13, 14, 17) and reduce the variation of background suppression in a time series.

SUMMARY

By using a regional arterial spin labeling (regASL) approach there is potential to visualize cortical perfusion of the anterior and posterior circulation separately. Acquisition can be speeded up without sacrificing the signal-to-noise ratio (SNR) of the resulting perfusion images by using the same control image (i.e. acquired without labeling of blood in a vessel) for all vascular territory measurements. This vascular territory perfusion measurement (regional ASL: regASL) is accomplished by creating prepared spin magnetization (e.g. inverted or saturated) in a specific blood vessel, instead of preparing spin magnetization in all feeding blood vessels. As in conventional ASL, two data sets are typically acquired in a downstream position: one with (label image) and one without preparation (control image) in one particular vessel.

If three different vascular territories are targeted only four instead of six data sets have to be acquired. Therefore, this cuts down the measurement by one third. However, only two out of those four data sets are used to calculate the perfusion signal of one territory. A more efficient method SNR-wise is to encode vascular territories in a way that all four data sets will be used for extraction of the perfusion signal of a single territory.

Presented here is an example of a method that acquires all three territories in one experiment yielding the same SNR and measurement time as the former methods for one territory. To achieve this, a labeling scheme is used, where blood within two vessels is tagged. The combination of the vessels is changed throughout the experiment, which allows separation of each single territory. By using an efficient readout technique the total acquisition time can further be reduced to 2 min., for example. This allows routine use in clinical protocols.

In theory, an ASL experiment can be viewed as kind of a phase cycle experiment, where the sign of the longitudinal spin magnetization of the inflowing blood changes between +1 (control image, or C image) and −1 (label image, or L image) if relaxation is neglected. In conventional phase cycling experiments the phase of one or more RF-pulses is changed ("cycled") over several repetitions. In ASL experiments extent and position of the inversion (or saturation) slab change between control and label image. In this regard, ASL experiments are similar to phase cycle experiments of length 2. In a non-limiting example described in this patent disclosure, the ASL experiment comprises 4 different phases, with the according inversion slabs covering different feeding vessels in each phase.

When ASL is extended to repetitive time series of ASL images to identify perfusion changes for functional MRI (fMRI) of the brain, the speed of the time series of ASL in previously known methods has been limited by the repeated acquisition of the pairs of blood label (L) and control (C) data to perform the ASL acquisition. With the discovery disclosed in this patent disclosure that effective images can be obtained on the assumption that there is essentially no change in the C data between temporal points in the time series, only a single C data set can be used redundantly for all time points of ASL measurement, to reduce the amount of data acquired by nearly one half, with no change in the signal to noise ratio in the ASL images. To account for possible movement of the person causing misregistrations in the time series, the C data can be obtained two or more times throughout the time series while still at lower frequency than in prior techniques with alternating L and C data sets.

To obtain fMRI functional activation studies, the L and C images can be aligned if there is head motion during the study and CBF maps can be computed by pair-wise subtraction of temporally adjacent control and labeled images. The CBF maps can be smoothed using a three-dimensional Gaussian kernels or by other means. Voxel-wise analysis of the functional imaging data carried out to compare the difference in responses evoked by the two conditions (e.g., finger tapping and rest), using the general linear model implemented with a δ function as response function, since the perfusion data do not have any substantial temporal autocorrelation. Contrast maps of parameters (activation—rest) and t-statistics maps corresponding to this contrast can be generated. The individual maps can be coregistered with the anatomical images and normalized to a template brain. Random-effects group t-maps can be generated by applying the unpaired t-test for the normalized contrast parameter values of all the subjects at each voxel.

While most previous implementations of ASL have used gradient-echo based imaging sequences for data acquisition, according to the approach disclosed in this patent specification single shot 3D GRASE imaging has been found preferable, as it is based on spin-echo and therefore reduces artifacts. The 3D GRASE sequence provides whole brain coverage in a single shot acquisition. This 3D volume acquisition is preferable over the 2D multi-slice acquisition of the EPI sequence at least because in the 2D scan the slices acquired later show reduced perfusion signal due to $T_1$ decay. Moreover, the 3D acquisition eliminates or at least reduces the possibility of slice interference that can occur in multi-slice 2D sequences and which is generally attenuated by doing interleaved acquisition. The 3D volume single shot acquisition can be performed in a total imaging time of 500 msec while the labelling requires up to 1500 ms and a 1000 ms delay in a specific example. Because all the k-space data can be sampled in one shot, a pair of labelled—unlabeled (L-C) images can be acquired every 6 sec (2×TR), and can be considered a maximum temporal resolution for collecting time series data for fMRI functional imaging studies. In general, the minimum time between images in the fMRI time series is minimally the time required to acquire control and label image sets or equals approximately 2×TR for whatever imaging sequence is used, EPI, GRASE, TSE or other SE based sequence. Certainly if additional signal averages (NSA) are used, the time resolution becomes approximately 2×TR×NSA.

CBF then can be computed pixel by pixel, using equation [1], as described in a 2005 article by J. Wang (18):

$$cbf = \frac{\Delta M}{M_o} \frac{\lambda}{2\alpha} \frac{R_{1a}}{\exp(-wR_{1a}) - \exp(-(\tau+w)R_{1a})} \quad [1]$$

where $\Delta M$ is the signal difference between label and control images, $M_o$ is the control image intensity, $\lambda$ is the blood/tissue water partition coefficient, $R_{1a}$ is the longitudinal relaxation rate of blood, $\tau$ is the duration of the labeling pulse, w is the post-labeling delay and $\alpha$ is the labeling efficiency.

BRIEF DESCRIPTION OF THE DRAWING

FIGS. 3a, 3b, and 3c illustrate MRI pulse sequences for, respectively, conventional pulsed ASL, conventional continuous ASL, and pseudo continuous ASL.

FIG. 4 illustrates an MRI sequence of prior art ASL time series using pairs of labeled and control images at incremental times T.

FIG. 5 illustrates using an MRI sequence of prior art ASL labeled and control images that are repeated four times and averaged.

FIGS. 6.1, 6.2, and 6.3 illustrate three examples of increased time resolution in time series of ASL images with shared control images in accordance with the disclosure in the patent specification.

FIGS. 7.1, 7.2, and 7.3 illustrate three examples of increased time resolution in time series of ASL images using different inflow times for each image in accordance with the disclosure in the patent specification.

DETAILED DESCRIPTION OF PREFERRED EMBODIMENTS

Figure 1:
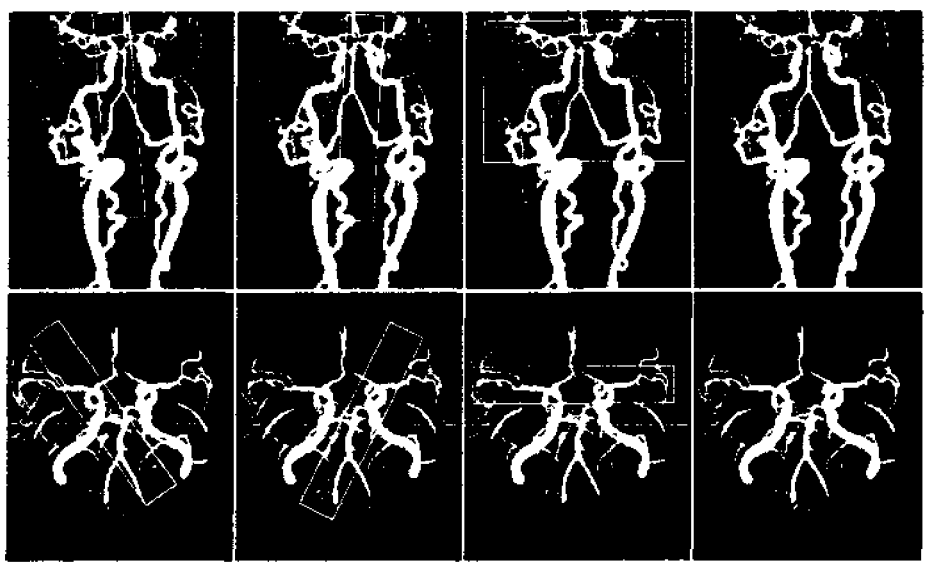
FIG. 1 illustrates the position and orientation of labeling slabs in cranial anatomy, where a four pulse cycle is shown, for separation of left and right ICA and basilar territory, and −1 denotes label image for the particular vessel while +1 represents a control image for this vessel.

The position and orientation of the inversion slab for each of 4 phases are shown in FIG. 1 for cranial anatomy. With this cycled labeling scheme the vascular territory of three vessels can be differentiated: left and right ICA and vertebral/basilar artery. In phase 1-3 the blood within two of those three vessels is labeled while it remains unchanged in the other one. The combination of labeled vessels changes with the phases.

By using the difference of any two of the images of a labeling phase, two vascular territories can be distinguished. For example, the difference of labeling phases 1 and 2 will show the signal of the left ICA (+1 in phase 1 and −1 in phase 2) with positive and the signal of the right ICA (−1 in phase 1 and +1 in phase 2) with negative values. The posterior region will not display since there is no remaining label (+1 in both phases). An even number of images is preferably used in reconstructing the vascular territories since otherwise the background signal of stationary tissue will not vanish. Therefore, it is advantageous to acquire an additional set of data if the number of regions to be separated is odd. This labeling phase 4 labels no blood and poses as a "stopgap" which allows the efficient use of all phases to reconstruct the vascular territory of each vessel. It can be shown that the proper linear combinations of the labeling phase is given by the rows of the table in FIG. 1, i.e. to separate the left ICA region phase 2 and 3 have to be subtracted from phase 1 and 4. Thus, images with different combinations of labeled arteries are combined to separate the corresponding vascular territories. A clinically useful setup is achieved by combining the regional labeling scheme with an efficient readout technique yielding a total measurement time of, e.g., 3 min for three vascular territories.

In a specific and non-limiting embodiment, measurements were performed on a clinical 1.5 T MR-Scanner (Magnetom Sonata, Siemens, Erlangen, Germany) with maximum gradients of 40 mT/m and a minimum rise time to full gradient strength of 200 µs.

Separation of three vascular territories (left and right ICA and basilar artery) was wanted. FIG. 1 shows the position of the inversion slabs on coronal and transverse projections of an MR angiography (MRA) data set.

Adiabatic RF-pulses (hyperbolic secans) were employed for inversion. Efficient post-labeling saturation of the imaging slab was realized by a four RF-pulse train as described in (7). This is necessary to ensure proper spoiling of the effect of any labeling pulse within the imaging slab.

A single-shot 3D-GRASE readout technique (10) was used with the following parameters: inflow time TI=1500 ms, echo time TE=36 ms, repetition time TR=2500 ms, off-resonance fat saturation pulse, 28 interpolated partitions (16 acquired, 5/8 Fourier). Twenty-four repetitions (total acquisition time: 2 min). An almost isotropic resolution of 4.7 mm×4.7 mm×4.5 mm was achieved.

After acquisition intensity images of all three vascular regions were combined into a single image by using three independent color channels (red, green, blue). The resulting data set was median filtered (isotropic 2 pixel) to improve display.

Figure 2:
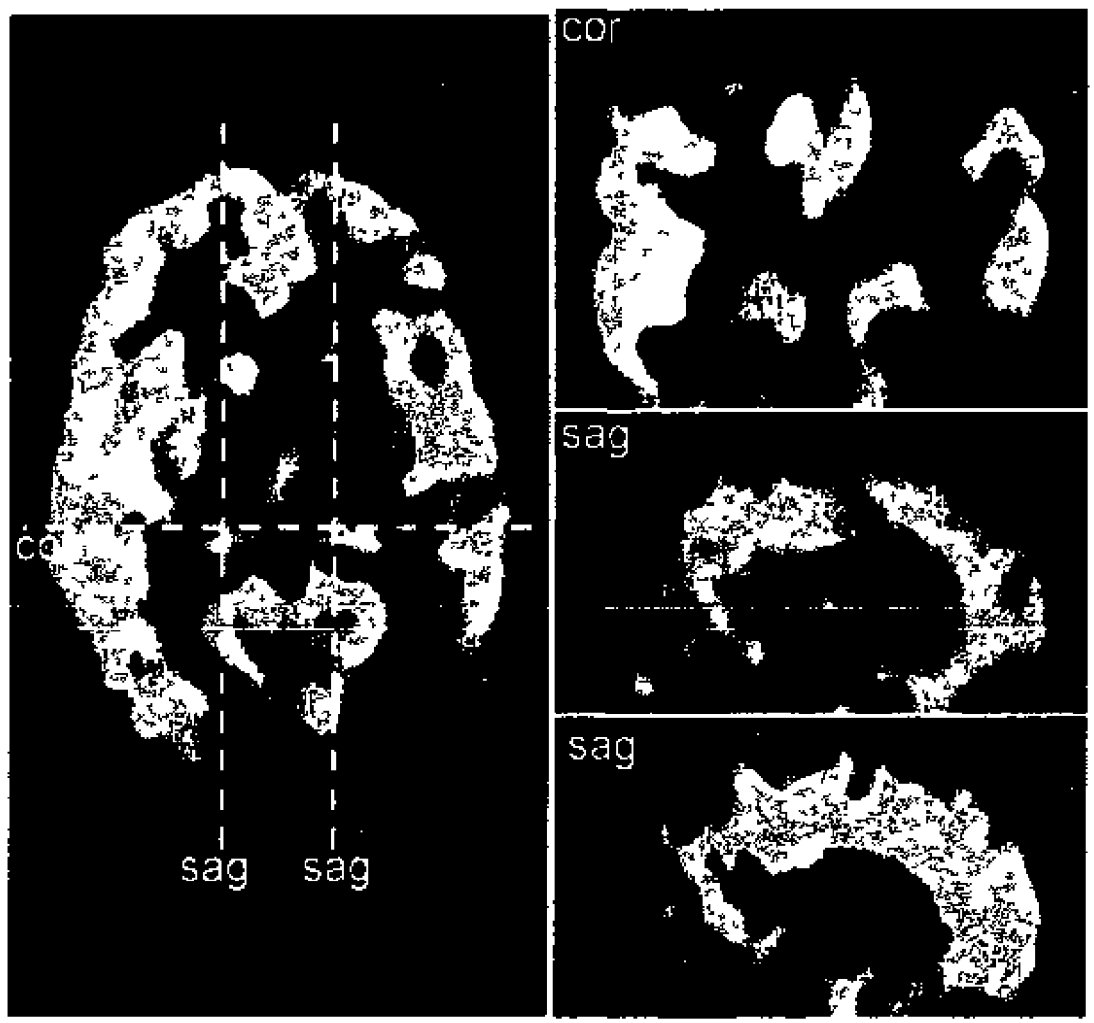
FIG. 2 illustrates transverse, coronal and sagital cut through median filtered 3D data set for the anatomy illustrated in FIG. 1, and color depicts different vascular territories (green=left ICA, red=right ICA, blue=basilar artery). In an example, acquisition time of the entire data set was two minutes.

Colored rCBF maps demonstrated the cortical vascular perfusion pattern providing a sharp delineation of anterior and posterior vascular territories in all subjects (see FIG. 2). Left ICA territory is green, right ICA territory is red and basilar artery territory is blue.

By selectively labeling blood spins in certain vessels, the vascular territory of this vessel can be visualized. Known publications on similar approaches have in common that each vascular territory is handled separately. This leads to very time-consuming experiments which are not easy to integrate into existing clinical protocols. The goal of the work described in this patent disclosure was to develop a more efficient technique which allows fast acquisition of at least three vascular territories (left and right ICA and basilar artery) in a time span such as two minutes. This was achieved by combining the measurement of all vascular regions in one experiment in a SNR-efficient way. An improved single-shot 3D readout technique was used, which increased the resulting SNR and allowed almost whole brain coverage within 2 minutes of measurement time in the non-limiting example discussed here-. Voxel-wise summation of the data sets of all vascular regions resulted in a data set which was of the same quality and SNR as acquired with conventional ASL technique. Therefore, most perfusion measurements performed with conventional ASL can be performed with regASL in the same measurement time without sacrifice in quality. This holds true for more complex ASL experiments like time series acquisitions, too, if at least two repetitions per time step are performed. Furthermore, regASL provides additional information on the vascular territories of at least three major vessel sub-trees. One challenge might be the longer preparation time for the technologist to position the labeling slabs.

The conventional ASL experiment (including prior vascular territory work) was viewed as a phase cycle experiment with two different states (control and label image). As a more efficient way to acquire more than one vascular territory a four phase cycle experiment was proposed and demonstrated, as an example. This comes with no penalty, since several repetitions have to be performed in standard ASL measurements due to poor SNR. In theory, twice as many vascular regions as repetitions (consisting of one control and label image) can be separated.

In general, N regions can be distinguished by N data sets with the proposed technique while there is need for at least N+1 data sets in the conventional technique. There might not be a big advantage in measurement time; however, the main improvement of the proposed technique is the increased SNR. By using linear combinations of labeled and unlabeled regions, an optimal SNR can be reached if N is even. In this case, all N data sets can be used to calculate the perfusion of one vascular region, instead of lust two measurements in the conventional experiment. If N is odd only N−1 data sets can be used for calculation since otherwise the background signal cannot be eliminated by subtraction. In this case it is favorable to acquire an additional data set without labeling to yield the optimal SNR per acquisition time. For one data set labeling of blood will be performed in multiple vessels, while there is no labeling of blood in the other vessels. Optimally, the number of labeled and non-labeled vessels equals N/2 if N is even and (N+1)/2 if N is odd. N different combinations of labeled and non-labeled vessels are acquired. By carefully choosing these combinations one can calculate the perfused area of each vessel by linear combination of all data sets. This represents the most efficient acquisition since each data set is used for calculation of each vascular region. Thus, SNR will be higher by a factor of sqrt(N)/sqrt(2) compared to standard techniques.

Care should be taken for positioning the labeling pulses; otherwise non-optimal separation of the vascular territories can occur. The measurements showed that proper separation can best be achieved with a previously acquired MRA data set. However, it can still be error-prone to position the labeling slabs, especially, if there are a large number of vessels to distinguish. Furthermore, it might not be possible to find the necessary combinations of vessels which can all be covered by one labeling slab. To overcome this problem the proposed technique can be extended and generalized by using a raster-like subdivision. This technique was used for high-resolution imaging (11) but is not known to have been applied to labeling pulses and ASL. The definition of the corresponding labeling slabs to create this raster can be determined by using Walsh functions. Walsh functions are defining eigenfunctions with function values of +1 and −1 only. Here, +1 represents no labeling while −1 represents labeling of the corresponding region. The separately acquired data sets can then be combined to yield the regional information using corresponding linear combinations as proposed in this work.

It was shown through the work reported in this patent disclosure that improved visualization of the cortical borders of vascular territories is feasible with regASL. Complete information on temporal behavior and vascular origin of local perfusion can be gained. The proposed technique adds the vascular territory information at no penalty, i.e., the additional information is acquired in the same measurement time and at the same quality (including SNR) as with standard ASL methods. This is a step to provide better anatomic information on cortical perfusion.

A basic principle in the approach disclosed in this patent specification is that in the acquisition of temporal measurements of ASL the signal variation in the time series due to a functional imaging study occurs in the label images but has essentially no effect on the unlabeled images. The blood flow in different brain regions will vary during the fMRI experiment as can be detected by the blood label images L. The unlabeled images C are used to subtract background signal occurring in static brain tissue, and therefore serve as a control. There is typically no movement of the patient's head during the image time series, as the head is held in place by standard methods of lateral and vertically paired pads on the sides of the head. The C images are essentially without inflowing blood signal and therefore are substantially identical in each time interval. There is no change in CBF measurement, SNR or in background static brain tissue suppression when using a single C image set to subtract background signal, or by using the prior method of acquiring multiple C images, one set for each set of L images. However, by using a single C image set, the L images can be run at substantially twice the rate due to the absence of interposed C images. The C image acquired at the beginning or end of the time series is subtracted from each L image set to obtain a time series of ASL images at substantially twice the rate (1×TR) of the prior time series using pairs of C and L images (2×TR). This faster imaging allows improved temporal resolution in the fMRI experiment, in the example above, L-C images acquired every 6 seconds can be acquired with consecutive L images in every 3 seconds.

It may be desirable in longer time series over several minutes for fMRI experiments to intermittently acquire control images to account for possible drifts in the MR scanner performance due to factors such as gradient heating or RF variations or patient motion. The series of L images has a less frequent interposed C image which is used with nearby L images as a control by means of subtraction or other means of mathematical normalization of signal. These are a few examples of several possible ways of acquiring fewer C images than L images in the time series of ASL images. The L images may themselves be averaged for improved SNR if motion effects are not limiting.

For the approach disclosed in this patent specification of faster time series of ASL images, if higher SNR is required it is possible to use multiple averages or other combiations (NSA=4) of L images and/or C images. For example, sets of 4 L images and 4 C images can be acquired in time sequences.

The approach disclosed in this patent specification can be extended to obtain a faster time series of ASL images which have variable sampling of different inflow times (TI) which is the time between labeling with an inversion pulse and the time of the image readout. Depending on the subject's specific blood arrival time, the time series of different TI can determine the specific timing of acquiring the maximum amount of blood within the capillary phase. By using fewer L images than C images, the entire experiment and measurement of the blood arrival time can be obtained faster.

Conventional pulsed and continuous ASL are illustrated in FIGS. 3a and 3b, respectively. In FIG. 3a, a label image is obtained using a label phase pulse that labels, e.g., blood that would flow in the ICA, waiting for an inflow time TI to allow for that blood to reach the cerebral region of interest, and then doing image readout. An example of a blood labeling pulse is a non-selective inversion RF pulse. For the control image, a control phase MRI pulse is applied before image readout. An example of a control pulse is a selective inversion RF pulse. FIG. 3b illustrates a conventional sequence in which the label phase is continuous before image readout and so is the control phase. Finally, FIG. 3c illustrates a method that uses a sequence of label phase pulsed and a sequence of control phase pulses before image readout.

Another prior art technique is illustrated in FIG. 4, where label MRI images L and control MRI images L are obtained in an alternating series, with incremental times T between the L and C images illustrates an MRI sequence of prior art ASL time series using pairs of labeled and control images at incremental times T. A variation is illustrated in FIG. 5, where several L images are obtained, then several C images, etc. In each of these prior art examples, the number of L and C images is the same.

An increased temporal resolution approach for ASL in accordance with the disclosure in this patent specification is illustrated in FIG. 8.1, where a control image C is obtained followed by a sequence of two or more label images that are labeled differently but can use the same inflow times. The control image C can be obtained before or after the label images L, or between two sets of L images. The single control image C is used for subtraction or other combination with any of the L images. The L images are taken at inflow times $T_1$, $T_2$ ..., $T_n$. FIG. 6.2 illustrates the case where two control images are taken, separated by two or more L images. The second control image C can be followed by additional L images. Each of the C images can be used for subtraction or other combination with the L images that follow and/or with any nearby (in time) preceding L images. FIG. 6.3 illustrates the case of using three (or more) C images, interspersed in the series of L images. Again, each of the C images can be used for subtraction or other combination with the L images that follow and/or with any nearby (in time) preceding L images. Where two or more C images are used, as in FIGS. 6.2 and 6.3, each C image can be combined only with a respective different set of L images to obtain an image representative of blood perfusion in a respective region, or two or more C images can be combined with each other to improve SNR and the result can be combined with the set, or a selected subset of, the L images.

For functional MRI in accordance with the disclosure in this patent specification, the inflow times $T_1, T_2 \ldots, T_n$ can be different. For example, for a label image L1, the inflow time can be $T_1$ but for label image L2 the inflow time $T_2$ can be different from $T_1$. Similarly, for a third label image L3 the inflow with $T_3$ can be different from $T_1$ and from $T_2$. Additional label images can be obtained in the same sequence, either with inflow time equal to L images previously obtained for use in improving SNR for any one or more L images, or with different inflow times for functional MRI purposes. FIG. 7.2 illustrates a sequence for functional MRI that is otherwise similar in that uses different inflow times for different L images but uses two (or more) control images C for purposes similar to those discussed in connection with FIG. 6.2. FIG. 7.3 illustrates a case similar to FIG. 7.2 but expressly shows the use of three control images C. When ASL is extended to repetitive time series of ASL images to identify perfusion changes for functional MRI (fMRI) of brain, the speed of the time series of ASL in previously known methods has been limited by the repeated acquisition of the pairs of blood label (L) and control (C) data to perform the ASL acquisition. With the discovery disclosed in this patent disclosure that effective images can be obtained on the assumption that there is essentially no change in the C data between temporal points in the time series, only a single C data set can be used redundantly for all time points of ASL measurement, to reduce the amount of data acquired by nearly one half, with no change in the signal to noise ratio in the ASL images. To account for possible movement of the person causing misregistrations in the time series, the C data can be obtained two or more times throughout the time series while still at lower frequency than in prior techniques with alternating L and C data sets.

It should be understood that the example described above are not all possible implementations of the subject matter disclosed in this patent specification, that other examples will be apparent to those skilled in the art based on the teachings provided here, and that the scope of the protected invention is governed by the appended claims and is not limited to the examples described in detail above.

REFERENCES

1. Nishimura D G, Macovski A, Pauly J M, Conolly S M. M R angiography by selective inversion recovery. Magn Reson Med 1987; 4(2):193-202.
2. Wang S J, Nishimura D O, Macovski A. Multiple-readout selective inversion recovery angiography. Magn Reson Med 1991; 1741):244-251.
3. Detre J A, Leigh J S, Williams D S, Koretsky A P. Perfusion imaging. Magn Reson Med 1992; 23(1):37-45.
4. Detre J A, Zhang W, Roberts D A, Silva A C, Williams D S, Grandis D J, Koretsky A P, Leigh J S. Tissue specific perfusion imaging using arterial spin labeling. NMR Biomed 1994; 7(1-2):75-82.

5. Edelman R R, Siewert B, Adamis M, Gaa J, Laub G, Wielopolski P. Signal targeting with alternating radiofrequency (STAR) sequences: application to MR angiography. Magn Reson Med 1994; 31(2):233-238.
6. Hendrikse J, van der Grond J, Lu H, van Zip P C, Golay X. Flow territory mapping of the cerebral arteries with regional perfusion MRI. Stroke 2004; 35(4):882-887.
7. Golay X, Petersen E T, Hui F. Pulsed star labeling of arterial regions (PULSAR): A robust regional perfusion technique for high field imaging. Magn Reson Med 2004; 53(1)15-21.
8. Eastwood J D, Holder C A, Hudgins P A, Song A W. Magnetic resonance imaging with lateralized arterial spin labeling. Magn Reson Imaging 2002; 20(8):583-586.
9. Davies N P, Jezzard P. Selective arterial spin labeling (SASL): perfusion territory mapping of selected feeding arteries tagged using two-dimensional radiofrequency pulses. Magn Reson Med 2003; 49(6)1133-1142.
10. Günther M O, K.; Feinberg, D. A. Single-Shot 3D Imaging Techniques Improve Arterial Spin Labeling Perfusion Measurements. Magn Reson Med 2005; in press.
11. Fletcher D W, Haselgrove J C, Bolinger L. High-resolution imaging using Hadamard encoding. Magn Reson Imaging 1999; 17(10):1457-1468.
12. Talagala, S. L. and D. C. Noll (1998). "Functional MRI using steady-state arterial water labeling." *Magnetic Resonance in Medicine* 39(2): 179-83.
13. Ye F Q, Frank J A, Weinberger D R, McLaughlin A C. Noise reduction in 3D perfusion imaging by attenuating the static signal in arterial spin tagging (ASSIST). Magn Reson Med 2000; 44(1):92-100.
14. Mani S, Pauly J, Conolly S, Meyer C, Nishimura D. Background suppression with multiple inversion recovery nulling: applications to projective angiography. Magn Reson Med 1997; 37(6):898-905.
15. Feinberg, D. A. and K. Oshio (1991). "GRASE (gradient- and spin-echo) MR imaging: a new fast clinical imaging technique." Radiology 181(2): 597-602.
16. Fernandez-Seara, M. A., J. Wang, et al. (2005). *Continuous arterial spin labelling perfusion measurements using single shot 3D GRASE at 3T*. International Society of Magnetic Resonance in Medicine, Miami.
17. Guenther, M., K. Oshio, et al. (2004). *Background suppressed 3D perfusion measurement using arterial spin labeling and single-shot 3D-GRASE*. International Society of Magnetic Resonance in Medicine, Kyoto, Japan.
18. Wang. J. (2005). "Amplitude modulated continuous arterial spin labeling perfusion MR with single coil at 3.0 Tesla." Radiology.

The invention claimed is:

1. A method of visualizing cortical vascular territories using magnetic resonance imaging comprising:
    labeling at least a first and second cortical vascular territories with different phases of MRI RF signals;
    acquiring MRI data from the labeled territories and reconstructing MRI images of the territories;
    selectively combining the reconstructed images from another and with a common unlabeled control image of the territories to obtain an image representative of cortical cerebral perfusion in at least one selected one of the cortical vascular territories.

2. A method of visualizing cortical vascular territories using magnetic resonance imaging comprising:
    labeling N cortical vascular territories with different phases, where N is a positive integer;
    acquiring N MRI data sets from the labeled territories and one or more, but less than N, data sets of the territories without labeling and reconstructing MRI images using the respective MRI data sets of the territories;
    selectively combining one of the reconstructed images of the labeled territories with a linear combination of two or more of the other images, including at least one image of the territories without labeling, to obtain an image representative of cortical cerebral perfusion in at least one selected one of the cortical vascular territories.

3. A method as in claim 2 in which the combining step obtains a single image representative of cortical cerebral perfusion in two or more of the territories labeled with different phases.

* * * * *